United States Patent [19]
Akimitsu et al.

[11] Patent Number: 5,578,554
[45] Date of Patent: Nov. 26, 1996

[54] METAL OXIDE MATERIAL AND METHOD OF MANUFACTURING THE SAME

[75] Inventors: Jun Akimitsu, Tokyo; Norio Kaneko, Atsugi; Tohru Den, Tokyo; Tamaki Kobayashi, Isehara, all of Japan

[73] Assignee: Canon Kabushiki Kaisha, Tokyo, Japan

[21] Appl. No.: 441,665

[22] Filed: May 15, 1995

Related U.S. Application Data

[63] Continuation of Ser. No. 81,707, Jun. 25, 1993, abandoned.

[30] Foreign Application Priority Data

| Jun. 26, 1992 | [JP] | Japan | 4-191438 |
| Jan. 14, 1993 | [JP] | Japan | 5-020772 |
| Jun. 18, 1993 | [JP] | Japan | 5-170890 |

[51] Int. Cl.$^6$ .......................... H01B 12/00; C04B 35/50
[52] U.S. Cl. .......................... 505/125; 505/779; 505/781; 423/593; 252/521
[58] Field of Search ........................ 505/100, 125, 505/776, 780, 785, 779, 233, 781, 742, 124; 423/593; 252/518, 521

[56] References Cited

U.S. PATENT DOCUMENTS

| 4,697,222 | 9/1987 | Kaneko et al. | 361/321 |
| 4,771,364 | 9/1988 | Kaneko et al. | 361/321 |
| 4,873,610 | 10/1989 | Shimizu et al. | 361/313 |
| 4,991,541 | 2/1991 | Sugata et al. | 118/716 |
| 5,019,553 | 5/1991 | Akimitsu et al. | 505/1 |
| 5,086,034 | 2/1992 | Balachandran | 505/742 |
| 5,116,369 | 5/1992 | Kushibiki et al. | 623/6 |
| 5,354,733 | 10/1994 | Kinoshita et al. | 505/125 |
| 5,424,281 | 6/1995 | Terutani et al. | 505/233 |

FOREIGN PATENT DOCUMENTS

| 0284438 | 9/1988 | European Pat. Off. . | |
| 0292340 | 11/1988 | European Pat. Off. | 505/779 |
| 0358997 | 3/1990 | European Pat. Off. . | |
| 2134881 | 5/1990 | Japan . | |

OTHER PUBLICATIONS

Liu "Superconductivity in $La_{2-x}Sr_xCaCu_2O_6$ at 60K" *Physica C* v. 174 Mar. 1, 1991 pp. 28–32.

A. Ono et al. "Preparation and Properties of Superconducting Copper Oxides, $(Pb,Cn)(SABa)_2(Y,Ca)Cu_2O_2$" Japanese Journal of Applied Physics, vol. 29 Jul. 1990.

Y. Matsumoto et al.; "Superconducting $Y_{1-x}L_xBa_{2-y}M_yCu_{3-z}N_zO_3$ System with Higher Tc Than 77K"; Materials Research Bulletin, vol. 23, 1988, pp. 1241–1246 no month available.

Y. Miyazaki et al.; "Importation and Crystal Structure of $S_{12}CuO_3(CO_3)$"; Physical Superconductivity; vol. 191, 15 Feb. 1992, pp. 434–440.

(List continued on next page.)

*Primary Examiner*—Paul Lieberman
*Assistant Examiner*—M. Kopec
*Attorney, Agent, or Firm*—Fitzpatrick, Cella, Harper & Scinto

[57] ABSTRACT

A metal oxide material comprises components, the composition of which is expressed by the following composition formula (I):

$$Ln_aCa_bSr_cBa_dCu_{2+e-h}M_hO_{6+f}C_g \qquad (I)$$

where
a+b+c+d=3, $0.2 \leq a \leq 0.8$,
$0.2 \leq b \leq 1.0$, $0.3 \leq c \leq 2.2$,
$0 \leq d \leq 1.7$, $0 \leq e \leq 0.8$,
$0 \leq h \leq 0.2$, $0 < f < 2.0$,
$0.2 \leq g \leq 1.0$, Ln is one or more elements or atomic groups selected from a group consisting of Y and lanthanoid elements and M is one or more elements or atomic groups selected from a group consisting of Al, Si, Ti, V, Cr, Fe, Co, Ga, Ge and Pd.

6 Claims, 4 Drawing Sheets

OTHER PUBLICATIONS

Physica C Superconductivity, vol. 191 (1992) Nos. 3 & 4, Feb. 15, 1992, Y. Miyazaki et al., "Preparation and Crystal Structure of . . . ".

Japanese Journal Of Applied Physics, vol. 29, No. 12, Dec. 1990, H. Murakami et al., "The Phase Diagrams of Y–System Superconductors".

Oyo Buturi 05, vol. 60, No. 5, 1991, "Recent Developments of Wire Fabrication Processes for High Temperature Superconductors" no month available.

METAL OXIDE MATERIAL AND METHOD OF MANUFACTURING THE SAME

This application is a continuation of application Ser. No. 08/081,707 filed Jun. 25, 1993, now abandoned.

BACKGROUND OF THE INVENTION

1. Field of the Invention

The present invention relates to a metal oxide material having electric conductivity and a process for preparation of the same. More particularly, the present invention relates to a metal oxide material having superconductive characteristics and a process for preparation of the same. The metal oxide material according to the present invention can be used in a variety of fields, such as various sensors, electronic elements, computers, medical devices, magnet, power-transmission lines, energy devices and voltage standard and the like.

2. Related Background Art

Since oxide superconductors containing copper, which have been sequentially found in recent years, have Tc (superconduction critical temperature) considerably higher than that of the conventional niobium type superconductors, applicability of the superconductor of the foregoing type has been examined in a multiplicity of fields.

Among the foregoing oxide superconductors containing copper, Y-type ($YBa_2Cu_3O_7$) material has been found and its applicability has been examined.

As the Y-type materials, there are superconductors having different crystalline structures and composition ratios. Their compositions are different in the quantity of copper and that of oxygen and the Y-type materials respectively are expressed by $YBa_2Cu_4O_8$ (124 structure) and $Y_2Ba_4Cu_7O_y$ (y is about 15, 247 structure). Since superconductors of the foregoing type composed of the same component elements have different characteristics such as the critical temperature (Tc), they are considerably affected by synthesizing conditions such as the partial pressure of oxygen and temperature. A figure showing the relationship between the factors, such as the mixture ratio and the temperature, and the composition of the material which can be easily prepared is disclosed in, for example, Japanese Journal of Applied Physics Vol. 29, No. 12, December, 1990, pp. 2720–2724. According to the foregoing document, the 124 structure is rather stably present than the 123 structure at about 750° C. or lower in a case where the ratio of positive ion is Y:Ba:Cu=1:2:3 under condition of an extremely usual partial pressure of oxygen of 1 atmospheric pressure. This means that, if the reaction temperature is lowered by a means, such as particulating of the raw material, a single-phase 123 structure cannot easily be obtained. If a temperature distribution is present at the time of heat treatment, a single phase cannot easily be realized. Further, the Y-type material essentially wants oxygen, and oxygen is introduced/discharged at 500° to 700° C. accompanying structural phase transition. Accordingly, heat treatment is very generally performed in which the Y-type material is subjected to annealing process at the foregoing temperature to convert the phase to a phase containing a large quantity of oxygen in order to improve the superconductive characteristics, for example, in order to raise Tc. It can be considered that the 124 structure is further stabilized during the foregoing process. That is, the Y-type ($YBa_2Cu_3O_7$) material formerly encounters a problem that it cannot easily be made the single phase.

Generally, if the material is not the single phase, if the material is material in which two types of superconductors are present while being mixed, the averaged material characteristics of the two phases determine the characteristics of the material due to the difference in the physical properties such as Tc of each phase and the superconductive critical current density (Jc) and the like. Therefore, a sharp transition to the superconductive state cannot take place or the essential superconductive characteristics of a sole superconductor cannot be exhibited sufficiently depending upon the situation. In electronics application field using a Josephson device and so forth, the device cannot be designed if the superconductive characteristics are not stable. As a result, the presence of a plurality of superconductive phases is a critical defect when a reliable device having excellent performance is inserted to be obtained.

The "single phase state" which particularly attracts attention in this embodiment is a state in which the grain boundaries of the superconductor are combined to each other while depositing no impurity phase in the grain boundaries of the foregoing Y-type material. The foregoing state does not mean a state where non-superconductors are dispersed in the crystalline particles for, so-called "flux pinning".

A consideration is made to realize power generation from, for example, a magnet, which utilizes one of the characteristics of the superconductive phenomenon, that is, no electric resistance, and which generates a high level magnetic field while using satisfactory small electric power consumption by flowing a large quantity of loss-less electric currents. In this case, if the "single phase state" is not realized particularly in an oxide superconductor due to deposition of impurities in the crystalline grain boundary, the quantity of the electric current is excessively restricted. Therefore, deterioration in the performance occurs.

If the deposited substance is chemically unstable, the superconductive characteristics of the material excessively deteriorate and causes aging to take place. The grain boundary of the Y-type material is easily weakened due to the impurity phase or the deposition of an amorphous phase. Occurrence of the foregoing problem has been discussed in Oyo Butsuri, Vol. 60, No. 5 (1991), pp 462 to 465.

As the copper oxide superconductor containing carbon and relating to the metal oxide material according to the present invention, material having a composition $Sr_{0.9}Ba_{1.1}Cu_{1.1}O_{2.2}(CO_3)_{0.9}$ has been disclosed in Nikkei Superconduction, Apr. 13, 1992. According to this disclosure, the temperature at which the resistance is zero is about 26K. Therefore, there arises a problem in that liquid helium or a large-cost cooling device must be used at the time of using the foregoing material. Physica C Vol.191 (1992) pp.434 to 440 has disclosed a similar material having a composition $Sr_2CuO_2(CO_3)$. Since $Sr_2CuO_2(CO_3)$ has no superconductivity at low temperature and exhibits a high electric resistance, it cannot be used as the oxide superconductor as well as the superconductor.

It is usually preferable that the critical temperature Tc is about 30K or higher, more preferably 50K or higher. The reason for this is that various superconductor products each containing the superconductive material, the critical temperature Tc of which is 30K, can usually stably be operated only when it is cooled to about a 10K lower than the critical temperature. Therefore, the cooling method is limited excessively. That is, it is necessary for the superconductor to be cooled to 30K or lower by using liquid helium as the cooling substance and heat insulation using liquid nitrogen or vacuum. Therefore, a great facility must be used to shield heat from the room temperature portions. Even if a cryopump is used, a great heat shield using vacuum or a plurality of heat insulating materials must be used. Although it is preferable that the temperature is about 30K or higher, more preferably 50K or higher, the heat shield can considerably easily be established in the foregoing temperature region. As a result, the cooling system can be simplified and the superconductive state can be maintained stably.

SUMMARY OF THE INVENTION

Accordingly, an object of the present invention is to provide a metal oxide material which can easily be made to be a single phase state and the characteristics of which can easily be controlled.

Another object of the present invention is to provide a process for preparation of a metal oxide material which can easily be made to be a single phase state and the characteristics of which can easily be controlled.

Another object of the present invention is to provide a metal oxide material having a high superconducting critical temperature of 50K or higher.

Another object of the present invention is to provide a process for preparation of a metal oxide material having a high superconducting critical temperature of 50K or higher.

In order to achieve the foregoing objects, according to one aspect of the present invention, there is provided a metal oxide material comprising components, the composition of which is expressed by the following composition formula (I):

$$Ln_aCa_bSr_cBa_dCu_{2+e-h}M_hO_{6+f}C_g \qquad (I)$$

where $a+b+c+d=3$, $0.2 \leq a \leq 0.8$, $0.2 \leq b \leq 1.0$, $0.3 \leq c \leq 2.2$, $0 \leq d \leq 1.7$, $0 \leq e \leq 0.8$, $0 \leq h \leq 0.2$, $0 < f < 2.0$, $0.2 \leq g \leq 1.0$, Ln is one or more elements or atomic groups selected from a group consisting of Y and lanthanoid elements and M is one or more elements or atomic groups selected from a group consisting of Al, Si, Ti, V, Cr, Fe, Co, Ga, Ge and Pd.

According to another aspect of the present invention, there is provided a process for preparation of a metal oxide material the composition of which is expressed by the following composition formula (I-A), comprising: heating a raw material to a temperature range from 600° C. to 1100° C. in an atmosphere in which the partial pressure of $CO_2$ is 0.01 to 1 atm and the partial pressure of $O_2$ is 10 to 400 atm:

$$Ln_aCa_bSr_cBa_dCu_{2+e}O_{6+f}C_g \qquad (I-A)$$

where $a+b+c+d=3$, $0.2 \leq a \leq 0.8$, $0.2 \leq b \leq 1.0$, $0.5 \leq c \leq 2.2$, $0 \leq d \leq 1.6$, $0 \leq e \leq 0.8$, $0 < f < 2.0$, $0.2 \leq g \leq 1.0$, Ln is one or more elements or atomic groups selected from a group consisting of Y and lanthanoid elements.

According to another aspect of the present invention, there is provided a process for preparation of a metal oxide material the composition of which is expressed by the following composition formula (I-B), comprising: heating a raw material to a temperature range from 800° C. to 1200° C. in an atmosphere in which the partial pressure of $CO_2$ is 0.001 to 0.2 atm and the partial pressure of $O_2$ is 0.2 atm or higher; and annealing the raw material at a temperature range from 400° C. to 1200° C. in an oxygen atmosphere of 5 atm or higher:

$$(Ln_{1-a}Ca_a)(Sr_{2-b}Ba_b)(Cu_{1-c}C_c)Cu_2O_{6+d} \qquad (I-B)$$

where $0.2 \leq a \leq 0.8$, $0.4 \leq b \leq 1.7$, $0.2 \leq c \leq 0.7$, $0 < d < 2.0$ Ln is one or more elements or atomic groups selected from a group consisting Y and of lanthanoid elements except for Ce, Pr and Tb.

According to another aspect of the present invention, there is provided a process for preparation of a metal oxide material the composition of which is expressed by the following composition formula (I-C), comprising: heating a raw material to a temperature range from 850° C. to 1100° C. in an atmosphere in which the partial pressure of $CO_2$ is 0.001 to 0.02 atm and the partial pressure of $O_2$ is 0.2 atm or higher; and annealing the raw material in an oxygen atmosphere range from 10 atm to 1000 atm:

$$(Ln_{1-a}Ca_a)(Sr_{2-b}Ba_b)(Cu_{1-c}C_c)Cu_2O_{6+d} \qquad (I-C)$$

where $0.4 \leq a \leq 0.8$, $0.8 \leq b \leq 1.6$, $0.3 \leq c \leq 0.7$, $0.5 \leq d \leq 1.5$ Ln is one or more elements or atomic groups selected from a group consisting of Y and lanthanoid elements except for Ce, Pr and Tb.

According to another aspect of the present invention, there is provided a process for preparation of a metal oxide material the composition of which is expressed by the following composition formula (I-D), comprising: heating a raw material in an atmosphere in which the partial pressure of $CO_2$ is 0.001 atm or higher and the partial pressure of $O_2$ is 0.2 atm or higher:

$$Ln_aCa_bSr_cBa_dCu_{2+e-h}M_hO_{6+f}C_g \qquad (I-D)$$

where $a+b+c+d=3$, $0.2 \leq a \leq 0.8$, $0.2 \leq b \leq 1.0$, $0.3c \leq 2.2$, $0 \leq d \leq 1.7$, $0 \leq e \leq 0.8$, $0.05 \leq h \leq 0.2$, $0 < f < 2.0$, $0.2 \leq g \leq 1.0$, Ln is one or more elements or atomic groups selected from a group consisting of Y and lanthanoid elements, and M is one or more elements or atomic groups selected from a group consisting of Al, Si, Ti, V, Cr, Fe, Co, Ga, Ge and Pd.

Other and further objects, features and advantages of the invention will be appear more fully from the following description.

DESCRIPTION OF THE PREFERRED EMBODIMENTS

Figure 1:
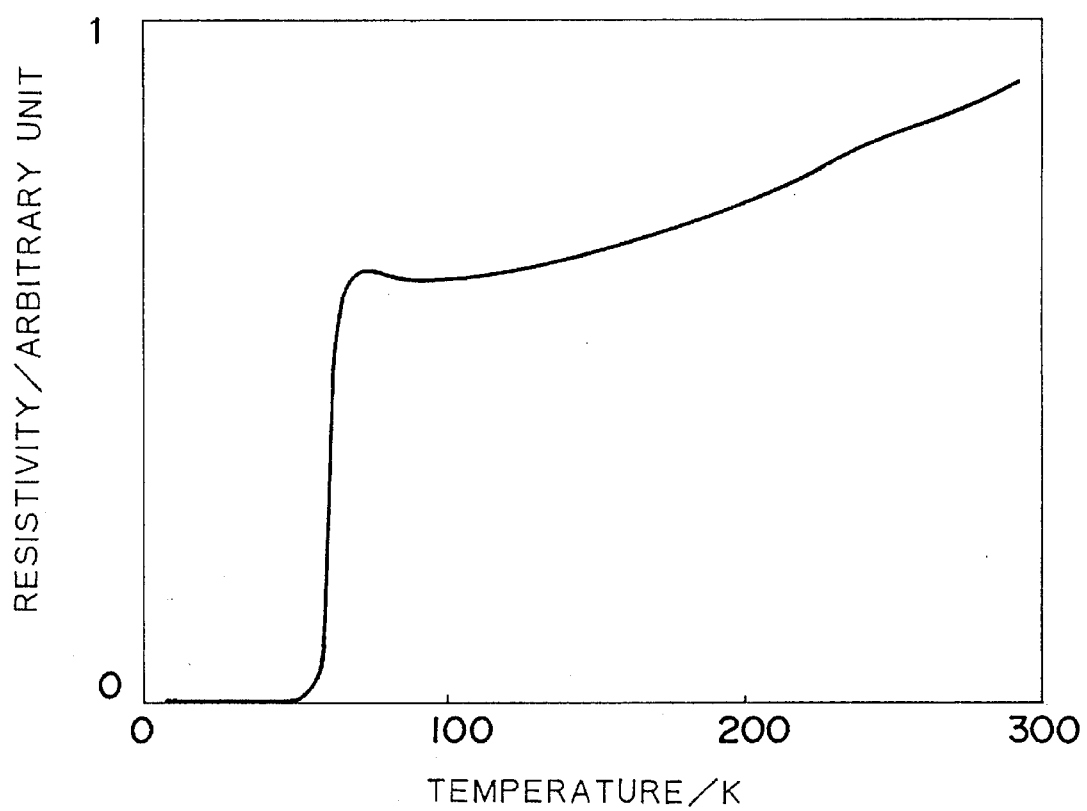
FIG. 1 is a graph which shows the result of measurement of the dependency of electric resistance upon the temperature according to Example 1.

Y-type 123 structures ($YBa_2Cu_3O_7$) of oxide superconductors of a type containing copper contains the copper at two different positions which are in the different atmospheres on the crystallographical viewpoint. One of the two positions for copper is the $CuO_2$ plane closely relating to the superconduction and performing a major role in the superconduction. The $CuO_2$ plane is an essential component unit of the oxide superconductor of the type containing copper. The other position for copper is a so-called "Cu-O chain layer" which is a component unit in which copper atoms and oxygen atoms are disposed alternately in a one-dimensional chain-like state. Copper in the Cu-O is present in contrast with coppers in the $CuO_2$ plane which form a two-dimensional network while interposing oxygen. As described above, the two types of copper atoms are present together with oxygen atoms in approximately the same plane and they are present in the different manner such that either of them is present while forming the two-dimensional network and the residual is present while forming the one-dimensional chain-like formation. The foregoing fact can be understood from the positional relationship from a Y-layer and Ba-O layers constituted by Y and Ba elements present vertically while interposing each layer. That is, the $CuO_2$ plane is interposed between the Y-layer and the Ba-O layer, while the Cu-O chain layer is interposed between the two Ba-O layers. Attention must be paid here that oxygen in the Cu-O chain layer easily lacks in the foregoing structure. Further, each of the foregoing 124-structure and 247-structure is formed by superimposing the two Cu-O chain layers or by periodically superimposing the same. That is, it is analogized that the Cu-O chain layer essentially has instability. The quantity of the lack of oxygen in the Cu-O chain layer closely relates to the superconductive characteristics. That is, the quantity of oxygen corresponds to the concentration of the carrier for realizing the superconduction. Namely, also the Cu-O chain layer is an essential component unit for the superconductor. The inventors intended to stabilize the unstable Cu-O chain layer while maintaining the superconductivity by periodically or non-periodically partially substituting copper of the Cu-O chain layer by a carbon element having smaller ion radius. As a result, a novel superconductor which can be easily made single phase could be synthesized. That is, the inventors found that a single-phase novel structure relating to the 123-structure can be prepared while preventing formation of the 124-structure and the 247-structure by shortening the distance between the Cu-O chain layer and the Ba-O layers positioned vertically while interposing the Cu-O chain. The reason why the structure according to the present invention is called the "structure relating to the 123-structure" is that it is a different structure in the crystallographical viewpoint from the Y-type 123 structure because it includes a portion in which oxygen is positioned at different positions from oxygen in the Y-type 123-structure. If forced to call it, it is considered correct that it is called 1212-structure. The present invention can be realized by substituting a portion of Ba by Sr which has an ion diameter smaller than that of Ba and which is an alkaline earth element and by substituting a portion of three divalent Y element by two divalent Ca element in order to control the carrier concentration. The present invention can also be realized by using specific element by a proper quantity together with carbon atoms.

That is, the metal oxide material according to the present invention is characterized by the following Composition Formula (I):

$$Ln_aCa_bSr_cBa_dCu_{2+e-h}M_hO_{6+f}C_g \quad (I)$$

where a+b+c+d=3, 0.2≦a≦0.8, 0.2≦b≦1.0, 0.3≦c≦2.2,

0≦d≦1.7, 0≦e≦0.8,

0≦h≦0.2, 0<f<2.0, 0.2≦g≦1.0,

Ln is one or more elements or atomic groups selected from a group consisting of Y and lanthanoid elements and M is one or more elements or atomic groups selected from a group consisting of Al, Si, Ti, V, Cr, Fe, Co, Ga, Ge and Pd.

The metal oxide material expressed by the foregoing formula (I) and according to the present invention is further characterized by the following Composition Formulas (I-1) to (I-3):

$$Ln_aCa_bSr_cBa_dCu_{2+e}O_{6+f}C_g \quad (I-1)$$

where a+b+c+d=3, 0.2≦a≦0.8, 0.2≦b≦1.0, 0.3≦c≦2.2,

0≦d≦1.7, 0≦e≦0.8,

0<f<2.0, 0.2≦g≦1.0,

Ln is one or more elements or atomic groups selected from a group consisting of Y and lanthanoid elements.

$$Ln_aCa_bSr_cBa_dCu_{2+e}O_{6+f}C_g \quad (I-2)$$

where a+b+c+d=3, 0.2≦a≦0.8, 0.2≦b≦1.0, 0.5≦c≦2.2,

0≦d≦1.6, 0≦e≦0.8,

0<f<2.0, 0.2≦g≦1.0,

Ln is one or more elements or atomic groups selected from a group consisting of Y and lanthanoid elements.

$$Y_{1-x}Ca_xSr_2Cu_{2+e}O_{6+f}C_g \quad (I-3)$$

where 0.3≦x≦0.8, 0≦e≦0.8,

0<f<2.0, 0.2≦g≦1.0.

The foregoing metal oxide materials according to the present invention are excellent superconductive materials having the foregoing "single-phase state". The "single-phase state" on the present invention can be confirmed by an X-ray diffraction measurement or a TEM measurement.

The value of the critical current density of the metal oxide material according to the present invention is larger than that of the conventional Y-type ($YBa_2Cu_3O_7$) material. This means that the metal oxide material exhibits significantly small impurities to be deposited in the grain boundary as compared with the $YBa_2Cu_3O_7$ material. It is preferable that critical current density ratio (α) to be described later is α≧1.1, preferably α≧1.4, and most preferably α≧1.7.

It is preferable that the volume fraction of the superconductor of the metal oxide material according to the present invention is 70% or more, more preferably 80% or more.

The foregoing fact also means that the metal oxide material according to the present invention has the excellent "single-phase state".

A process for preparation of the metal oxide material according to the present invention will now be described.

It is preferable that the conditions for the process for preparation of the metal oxide material according to the present invention are established as follows depending upon the composition formulas of the desired materials.

$$Ln_aCa_bSr_cBa_dCu_{2+e}O_{6+f}C_g \quad \text{(I-A)}$$

where a+b+c+d=3, $0.2 \leq a \leq 0.8$, $0.2 \leq b \leq 1.0$, $0.5 \leq c \leq 2.2$, $0 \leq d \leq 1.6$, $0 \leq e \leq 0.8$, $0 < f < 2.0$, $0.2 \leq g \leq 1.0$, Ln is one or more elements or atomic groups selected from a group consisting of Y and lanthanoid elements.

The process for preparation of the metal oxide expressed by the foregoing composition formula (I-A) is characterized by a heat treatment process in which the material is heated to a temperature range from 600° C. to 1100° C. in an atmosphere in which the partial pressure of $CO_2$ is 0.01 to 1 atm and the partial pressure of $O_2$ is 10 to 400 atm.

$$(Ln_{1-a}Ca_a)(Sr_{2-b}Ba_b)(Cu_{1-c}C_c)Cu_2O_{6+d} \quad \text{(I-B)}$$

where $0.2 \leq a \leq 0.8$, $0.4 \leq b \leq 1.7$, $0.2 \leq c \leq 0.7$, $0 < d < 2.0$ Ln is one or more elements or atomic groups selected from a group consisting of Y and lanthanoid elements except for Ce, Pr and Tb.

The process for preparation of the metal oxide expressed by the foregoing composition formula (I-B) is characterized by a heat treatment process in which the material is heated to a temperature range from 800° C. to 1200° C. in an atmosphere in which the partial pressure of $CO_2$ is 0.001 to 0.2 atm. and the partial pressure of $O_2$ is 0.2 atm or higher and by an annealing process set to a temperature range from 400° C. to 1200° C. in an oxygen atmosphere of 5 atm or higher.

$$(Ln_{1-a}Ca_a)(Sr_{2-b}Ba_b)(Cu_{1-c}C_c)Cu_2O_{6+d} \quad \text{(I-C)}$$

where $0.4 \leq a \leq 0.8$, $0.8 \leq b \leq 1.6$, $0.3 \leq c \leq 0.7$, $0.5 \leq d \leq 1.5$ Ln is one or more elements or atomic groups selected from a group consisting of Y and lanthanoid elements except for Ce, Pr and Tb.

The process for preparation of the metal oxide expressed by the foregoing composition formula (I-C) is characterized by a heat treatment process in which the material is heated to a temperature range from 850° C. to 1100° C. in an atmosphere in which the partial pressure of $CO_2$ is 0.001 to 0.02 atm and the partial pressure of $O_2$ is 0.2 atm or higher and by an annealing process in an oxygen atmosphere range from 10 atm to 1000 atm.

$$Ln_aCa_bSr_cBa_dCu_{2+e-h}M_hO_{6+f}C_g \quad \text{(I-D)}$$

where a+b+c+d=3, $0.2 \leq a \leq 0.8$, $0.2 \leq b \leq 1.0$, $0.3 \leq c \leq 2.2$, $0 \leq d \leq 1.7$, $0 \leq e \leq 0.8$, $0.05 \leq h \leq 0.2$, $0 < f < 2.0$, $0.2 \leq g \leq 1.0$, Ln is one or more elements or atomic groups selected from a group consisting of Y and lanthanoid elements and M is one or more elements or atomic groups selected from a group consisting of Al, Si, Ti, V, Cr, Fe, Co, Ga, Ge and Pd.

The process for preparation of the metal oxide expressed by the foregoing composition formula (I-D) is characterized by a heat treatment process to be performed in an atmosphere in which the partial pressure of $CO_2$ is 0.001 atm or higher and the partial pressure of $O_2$ is 0.2 atm or higher.

The material for the foregoing process may be O, C and oxides or carbonates of each element (Ln, Ca, Sr, Ba, M and Cu), the quantity of which oxides or carbonates is determined in accordance with the composition ratio of the desired final product.

The metal oxide material prepared by the foregoing materials and the process is also a very effective material to be used in the form of a thin film or a thick film. It can be used in a sputtering method using a target containing the compound according to the present invention, such as a high-frequency sputtering method or a magnetron sputtering method and in a spraying method.

The Tc of a copper oxide material obtainable from the metal oxide material and the process according to the present invention reaches 50K to 120K although the superconducting transition temperature is different depending upon the baking condition and the composition. Therefore, the superconductor according to the present invention and one prepared by the process according to the present invention can be used in a simple cooling machine such as a cryopump or a cooling means using liquid nitrogen as well as at the liquid helium temperature.

EXAMPLES

Examples and comparative examples of the present invention will now be described further in detail.

Examples 1 to 10 and Comparative Examples 1 to 10

As the material, $Y_2O_3$, $CaCO_3$, $SrCO_3$, $BaCO_3$, CuO, $Al_2O_3$, $SiO_2$, $TiO_2$, $V_2O_5$, $Cr_2O_3$, $Fe_2O_3$, $Co_2O_3$, $Ga_2O_3$, $GeO_2$, PdO, $MnO_2$, NiO, ZnO, $Nb_2O_5$, $MoO_3$, $RuO_2$, $HfO_2$, $Ta_2O_5$, $WO_3$ and $ReO_3$ were used. Each of their mixtures was formed into a pellet shape having a diameter of 10 mm and a thickness of 1 mm by applying pressure. The pellet products were baked on an alumina boat in air, the temperature of which was 800° to 1000° C., and then again pulverized to be mixed. Then, they were again baked to 700° to 900° C. in an atmosphere in which 0.1 atm $CO_2$ and 50 atm oxygen were present. As a result, copper oxides respectively according to the present invention and comparative examples were prepared.

The electric resistance and the magnetic susceptibility of the foregoing samples were measured in a temperature range from the room temperature to the liquid helium temperature. Further, X-ray diffraction and EPMA were measured. The quantity of oxygen includes an error about 10 to 20% occurring in the measurement. Samples judged as the single phase in the measurement of the X-ray diffraction were further discriminated whether or not their fine portions had the single phase by measuring the TEM. In order to examine whether or not deposition of impurities and so forth took place in the grain boundaries, proportion α of each sample with respect to the critical current density of the Y-type material was measured under the same conditions, in which the Y-type material was baked in an oxygen atmosphere and had a critical temperature Tc of 93K. The critical current density was measured at 30K by a DC four-probe method.

Table 1 shows the composition ratio, the superconducting transition temperature Tc (unit is K) and the proportion $\alpha$ of the critical current density of the Y-type material to that of the samples according to the present invention. As can be seen from Table 1, all of the metal oxide materials according to the present invention show the superconductive transition when Tc is 50K or higher. Further, the relative critical electric current densities of all of the samples according to the present invention to that of the Y-type material were larger than 1. Therefore, it can be understood that excellent bonding was realized in the grain boundary. As a result of the measurements of the X-ray diffraction and the TEM, all of the samples according to the present invention had the single structure, that is, the single phase. The magnetic susceptibility was evaluated by observing Meissner signal peculiar to the superconduction at temperatures corresponding to each Tc. Further, the volume fraction of the superconductor attained a little less than 80%, whereby it was confirmed that the excellent superconductive characteristics was attained.

Table 2 shows the injection composition according to comparative examples. The samples according to the comparative examples shown in Table 2, which contain elements except for the component elements according to the present invention, are not single phase as a result of the measurement of the X-ray diffraction. A portion of them did not show the superconductive transition and a portion of them had a low Tc of 50K or lower if they showed the superconductive transition while having a superconductive volume fraction of 40% or lower. As can be understood from the foregoing facts, they had unsatisfactory superconductive characteristics. As for the electric resistance, the samples had a high electrical resistivity at the room temperature which was two or more times that of the samples according to the present invention. Therefore, the samples had unsatisfactory characteristics to serve as electric conductors.

TABLE 1

| Example No. | Composition ratio | Tc (K) | Critical Current Density Ratio $\alpha$ |
|---|---|---|---|
| 1 | $Y_{0.5}Ca_{0.5}Sr_{0.7}Ba_{1.3}Cu_{2.3}Al_{0.1}O_7C_{0.6}$ | 85 | 2.2 |
| 2 | $Y_{0.5}Ca_{0.5}Sr_{0.7}Ba_{1.3}Cu_{2.5}Si_{0.05}O_7C_{0.45}$ | 83 | 2.0 |
| 3 | $Y_{0.5}Ca_{0.5}Sr_{0.7}Ba_{1.3}Cu_{2.2}Ti_{0.2}O_7C_{0.6}$ | 84 | 2.8 |
| 4 | $Y_{0.5}Ca_{0.5}Sr_{0.7}Ba_{1.3}Cu_{2.3}V_{0.1}O_7C_{0.6}$ | 87 | 2.4 |
| 5 | $Y_{0.5}Ca_{0.5}Sr_{0.7}Ba_{1.3}Cu_{2.25}Cr_{0.2}O_7C_{0.55}$ | 85 | 1.9 |
| 6 | $Y_{0.5}Ca_{0.5}Sr_{0.7}Ba_{1.3}Cu_{2.25}Fe_{0.15}O_7C_{0.6}$ | 57 | 1.2 |
| 7 | $Y_{0.5}Ca_{0.5}Sr_{0.7}Ba_{1.3}Cu_{2.2}Co_{0.2}O_7C_{0.6}$ | 77 | 1.8 |
| 8 | $Y_{0.5}Ca_{0.5}Sr_{0.7}Ba_{1.3}Cu_{2.3}Ga_{0.1}O_7C_{0.6}$ | 83 | 2.1 |
| 9 | $Y_{0.5}Ca_{0.5}Sr_{0.7}Ba_{1.3}Cu_{2.3}Ge_{0.1}O_7C_{0.6}$ | 86 | 2.3 |
| 10 | $Y_{0.5}Ca_{0.5}Sr_{0.7}Ba_{1.3}Cu_{2.5}Pd_{0.05}O_7C_{0.45}$ | 70 | 1.4 |

TABLE 2

| Comparative Example No. | Injection Composition |
|---|---|
| 1 | $Y_{0.5}Ca_{0.5}Sr_{0.7}Ba_{1.3}Cu_{2.2}Mn_{0.2}O_7C_{0.6}$ |
| 2 | $Y_{0.5}Ca_{0.5}Sr_{0.7}Ba_{1.3}Cu_{2.2}Ni_{0.2}O_7C_{0.6}$ |
| 3 | $Y_{0.5}Ca_{0.5}Sr_{0.7}Ba_{1.3}Cu_{2.2}Zn_{0.2}O_7C_{0.6}$ |
| 4 | $Y_{0.5}Ca_{0.5}Sr_{0.7}Ba_{1.3}Cu_{2.2}Nb_{0.2}O_7C_{0.6}$ |
| 5 | $Y_{0.5}Ca_{0.5}Sr_{0.7}Ba_{1.3}Cu_{2.2}Mo_{0.2}O_7C_{0.6}$ |
| 6 | $Y_{0.5}Ca_{0.5}Sr_{0.7}Ba_{1.3}Cu_{2.2}Ru_{0.2}O_7C_{0.6}$ |
| 7 | $Y_{0.5}Ca_{0.5}Sr_{0.7}Ba_{1.3}Cu_{2.2}Hf_{0.2}O_7C_{0.6}$ |

TABLE 2-continued

| Comparative Example No. | Injection Composition |
|---|---|
| 8 | $Y_{0.5}Ca_{0.5}Sr_{0.7}Ba_{1.3}Cu_{2.2}Ta_{0.2}O_7C_{0.6}$ |
| 9 | $Y_{0.5}Ca_{0.5}Sr_{0.7}Ba_{1.3}Cu_{2.2}W_{0.2}O_7C_{0.6}$ |
| 10 | $Y_{0.5}Ca_{0.5}Sr_{0.7}Ba_{1.3}Cu_{2.2}Re_{0.2}O_7C_{0.6}$ |

Other examples and comparative examples will now be described to explain the present invention.

Examples 11 to 20 and Comparative Examples 11 to 20

As the materials, $Y_2O_3$, $Dy_2O_3$, $Er_2O_3$, $CaCO_3$, $SrCO_3$, $BaCO_3$ and $CuO$ were used. They were weighed to have a proper composition ratio, and then they were dry mixed. Each of the mixtures was formed into a pellet shape having a diameter of 10 mm and a thickness of 1 mm by applying pressure. The pellet products were baked on an alumina boat in air, the temperature of which was 800° to 1000° C., and then again pulverized to be mixed. Then, they were again baked to 700° to 900° C. in an atmosphere in which 0.1 atm $CO_2$ and 100 atm oxygen were present. As a result, copper oxides respectively according to the present invention and comparative examples were prepared.

The electric resistance and the magnetic susceptibility of the foregoing samples were measured in a temperature range from the room temperature to the liquid helium temperature. Further, X-ray diffraction and EPMA were measured. The quantity of oxygen includes an error about 10 to 20% occurring in the measurement.

Samples judged as the single phase in the measurement of the X-ray diffraction were further discriminated by measuring the TEM whether or not their fine portions had the single phase. In order to examine whether or not deposition of impurities and so forth took place in the grain boundaries, proportion $\alpha$ of the critical current density in each sample to that of the Y-type material was measured under the same conditions, in which the Y-type material was baked in an oxygen atmosphere and had a critical temperature Tc of 93K. The critical current density was measured at 30K by a DC four-probe method.

Table 3 shows the composition ratios, the transition temperatures (K) and the critical electric current density ratios $\alpha$ of the samples according to the present invention. As can be seen from Table 3, all of the oxide materials according to the present invention had superconductively transited at Tc=50K or higher.

Table 4 shows the injection compositions and the electric characteristics of the samples according to the comparative examples. As can been seen from Table 4, the samples except for those according to the present invention did not superconductively transited. Even if they superconductively transited, it took at a low temperature of 10K or lower.

Figure 2:
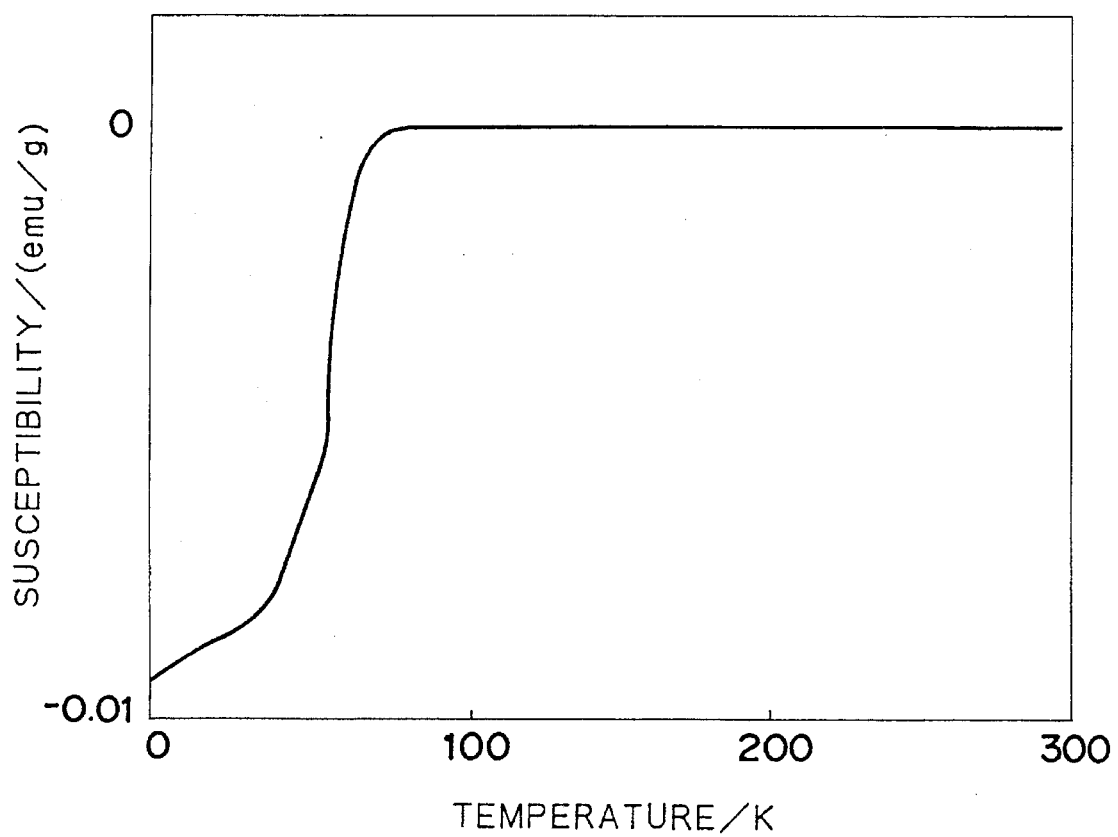
FIG. 2 is a graph which shows the result of measurement of the dependency of susceptibility upon the temperature according to Example 1.
Figure 3:
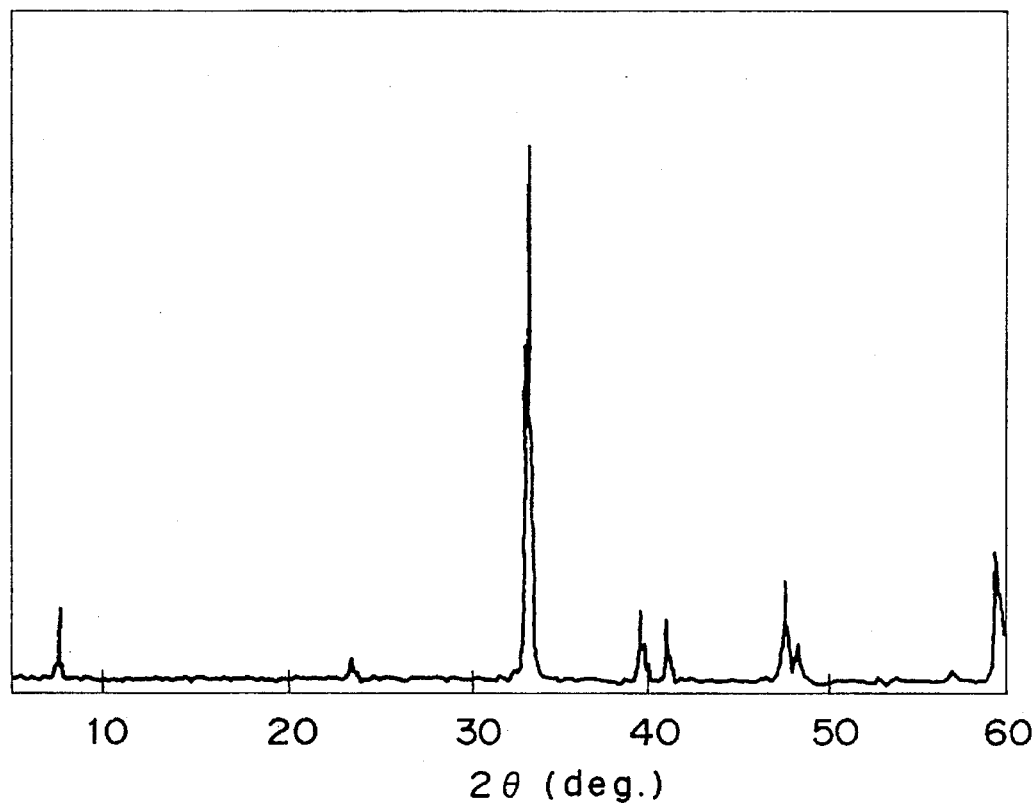
FIG. 3 is a chart which shows the result of measurement of the X-ray diffraction according to Example 1.

FIG. 1 is a graph showing the temperature dependency of the electrical resistivity of Example 11. As can be seen from the graph, the superconductive transition took place at 70K and the resistance was zero at 60K. FIG. 2 is a graph showing the temperature dependency of the susceptibility of Example 11. As can be seen from FIG. 2, the Meissner signal was observed at 70K or higher and the superconductive volume fraction reached about 80% or less. Therefore, excellent superconductivity was attained. FIG. 3 shows the X-ray diffraction pattern of Example 11. As can be seen from FIG. 3, the material has a tetragonal system of a=0.385 nm and c=1.12 nm.

Further, the critical current density ratio α of the critical current density in each of the samples according to the present invention to that of the Y-type material were larger than 1. Further, it can be understood that excellent bonding was realized in the grain boundary. As a result of the measurements of the X-ray diffraction and the TEM, all of the samples according to the present invention had the single structure, that is, the single phase.

TABLE 3

| Example No. | Composition Ratio | Tc (K) | Critical Current Density Ratio α |
|---|---|---|---|
| 11 | $Y_{0.4}Ca_{0.6}Sr_2Cu_{2.3}O_7C_{0.7}$ | 70 | 1.5 |
| 12 | $Dy_{0.4}Ca_{0.6}Sr_2Cu_{2.3}O_7C_{0.7}$ | 52 | 1.2 |
| 13 | $Er_{0.4}Ca_{0.6}Sr_2Cu_{2.3}O_7C_{0.7}$ | 82 | 2.0 |
| 14 | $Y_{0.2}Ca_{0.8}Sr_2Cu_{2.3}O_{6.5}C_{0.7}$ | 60 | 1.4 |
| 15 | $Y_{0.8}Ca_{0.2}Sr_2Cu_{2.3}O_{7.5}C_{0.7}$ | 51 | 1.1 |
| 16 | $Y_{0.6}Ca_{1.0}Sr_{1.4}Cu_{2.5}O_7C_{0.5}$ | 59 | 1.3 |
| 17 | $Y_{0.3}Ca_{0.6}Sr_{0.5}Ba_{1.6}Cu_{2.3}O_7C_{0.7}$ | 86 | 2.2 |
| 18 | $Y_{0.4}Ca_{0.4}Sr_{2.2}Cu_{2.8}O_{6.5}C_{0.2}$ | 67 | 1.7 |
| 19 | $Y_{0.4}Ca_{0.6}Sr_2Cu_{2.0}O_{7.5}C_{1.0}$ | 52 | 1.2 |
| 20 | $Dy_{0.2}Er_{0.2}Ca_{0.6}Sr_2Cu_{2.2}O_7C_{0.8}$ | 55 | 1.3 |

TABLE 4

| Comparative Example No. | Injection Composition | Electrical Characteristics |
|---|---|---|
| 11 | $Y_{0.9}Ca_{0.1}Sr_2Cu_{2.3}O_7C_{0.7}$ | Semiconductor-like |
| 12 | $Y_{0.4}Ca_{1.1}Sr_{1.5}Cu_{2.3}O_7C_{0.7}$ | 8K |
| 13 | $Y_{1.1}Ca_{0.5}Sr_{1.4}Cu_{2.3}O_7C_{0.7}$ | Semiconductor-like |
| 14 | $CaSr_2Cu_{2.2}O_7C_{0.8}$ | Semiconductor-like |
| 15 | $Y_{0.6}Ca_2Sr_{0.4}Cu_{2.5}O_7C_{0.5}$ | Semiconductor-like |
| 16 | $Y_{0.3}Ca_{0.3}Sr_{2.4}Cu_{2.5}O_7C_{0.5}$ | Semiconductor-like |
| 17 | $Y_{0.4}Ca_{0.6}Sr_{0.3}Ba_{2.2}Cu_{3.6}O_8C_{0.7}$ | 9K |
| 18 | $Y_{0.4}Ca_{0.6}Sr_{1.9}Cu_{1.8}O_{5.9}C_{0.3}$ | 8K |
| 19 | $Y_{0.4}Ca_{0.6}Sr_2Cu_{2.9}O_7C_{0.1}$ | Semiconductor-like |
| 20 | $Y_{0.4}Ca_{0.6}Sr_2Cu_2O_{7.2}C_{1.2}$ | Semiconductor-like |

Then, other examples and comparative examples will now be described to explain the present invention.

Examples 21 to 25 and Comparative Examples 21 to 25

As the material, $Y_2O_3$, $CaCO_3$, $SrCO_3$ and CuO were used, they were weighed to have a proper composition ratio in Example 11, and then they were dry mixed. Each of the mixtures was formed into a pellet shape having a diameter of 10 mm and a thickness of 1 mm by applying pressure. The pellet products were baked on an alumina boat in an atmosphere comprised of $CO_2$ partial pressure of 0.1 atm and oxygen partial pressure of 0.9 atm at 900° to 1000° C., and then again pulverized to be mixed. Then, they were again baked at a proper temperature in an atmosphere in which oxygen gas, $CO_2$ gas and argon gas were present at proper partial pressures. The electric resistance of the samples thus obtained was measured in a temperature range from the room temperature to the liquid helium temperature.

Samples judged as the single phase in the measurement of the X-ray diffraction were further discriminated by measuring the TEM whether or not their fine portions had the single phase. In order to examine whether or not deposition of impurities and so forth took place in the grain boundaries, proportion α of the critical current density of each sample to that of the Y-type material was measured under the same conditions, in which the Y-type material was baked in an oxygen atmosphere and had a critical temperature Tc of 93K. The critical current density was measured at 30K by a DC four-probe method.

Table 5 shows the partial pressure, the baking temperature and the superconducting transition temperature. As can be seen from Table 5, all of the metal oxide materials according to the present invention had superconductively transited.

Further, the critical current density ratio α of the critical current density in each of the samples according to the present invention to that of the Y-type material were larger than 1. Further, it can be understood that excellent bonding was realized in the grain boundary. As a result of the measurements of the X-ray diffraction and the TEM, all of the samples according to the present invention had the single structure, that is, the single phase.

Table 6 shows the partial gas pressure, the baking temperature and the electrical characteristics of each of the samples according to the comparative example.

As can be seen from Table 6, the samples manufactured under the conditions except for those of the manufacturing method according to the present invention do not show the superconductive transition. Even if the superconductive transition occurs, it took place at a temperature of 10K or lower.

TABLE 5

| Example No. | Partial Pressure of Oxygen gas (atm) | Partial Pressure of $CO_2$ gas (atm) | Partial Pressure of Argon gas (atm) | Baking Temperature (°C.) | Tc (K) | Critical Current Density Ratio α |
|---|---|---|---|---|---|---|
| 21 | 100 | 0.1 | 0 | 700 | 70 | 1.5 |
| 22 | 400 | 1.0 | 0 | 700 | 65 | 1.4 |
| 23 | 100 | 0.1 | 0 | 1,000 | 52 | 1.2 |
| 24 | 100 | 0.1 | 400 | 650 | 51 | 1.2 |
| 25 | 10 | 0.01 | 0 | 750 | 63 | 1.4 |

TABLE 6

| Comparative Example No. | Partial Pressure of Oxygen gas (atm) | Partial Pressure of $CO_2$ gas (atm) | Partial Pressure of Argon gas (atm) | Baking Temperature (°C.) | Electric Characteristics (K) |
|---|---|---|---|---|---|
| 21 | 1 | 0.1 | 0 | 700 | Semiconductor like |
| 22 | 600 | 2.0 | 0 | 1,000 | 5 |
| 23 | 100 | 0.001 | 0 | 700 | Semiconductor like |
| 24 | 100 | 0.1 | 400 | 1,200 | Semiconductor like |
| 25 | 100 | 0.1 | 0 | 550 | Semiconductor like |

Effects (1) According to the present invention, a novel superconductive oxide material having satisfactory characteristics to serve as a superconductor can be obtained because the superconducting transition temperature of which is 50K or higher.

(2) According to the present invention, a novel single-phase superconductive oxide material can be obtained.

(3) By using the processes according to the present invention, the structure and the superconductive characteristics of the material according to the present invention can stably be obtained.

Examples 26 to 36

As the materials, $Y_2O_3$, $Nd_2O_3$, $Er_2O_3$, $Lu_2O_3$, $CaCO_3$, $SrCO_3$, $BaCO_3$ and CuO were used. They were weighed to have a proper composition ratio, and then they were dry mixed.

Each of the mixtures was formed into a pellet shape having a diameter of 10 mm and a thickness of 1 mm by applying pressure. The pellet products were baked on an alumina boat in an atmosphere, the temperature of which was 900° to 1100° C. and in which 0.01 atmosphere $CO_2$ and 0.99 atmosphere oxygen were present. Then, the samples were annealed at 900° to 1100° C. under 50 atm oxygen so that the copper oxide material according to the present invention was prepared.

The electrical resistance and the susceptibility of the obtained samples were measured in a temperature range from the room temperature to the liquid helium temperature. Further, the X-ray diffraction and EPMA were measured. The quantity of oxygen includes an error of about 20% due to the measurement operation.

Samples judged as the single phase in the measurement of the X-ray diffraction were further discriminated by measuring the TEM whether or not their fine portions had the single phase. In order to examine whether or not deposition of impurities and so forth took place in the grain boundaries, proportion α of the critical current density in each sample to that of the Y-type material was measured under the same conditions, in which the Y-type material was baked in an oxygen atmosphere and had a critical temperature Tc of 93K. The critical current density was measured in a magnetic field, the temperature of which was 30K by a DC four-Probe method.

Table 7 shows the composition ratio of the metal oxides according to the present invention, their transition commencement temperature Tc (K) and the critical electric current density α. As can be seen from Table 7, all of the oxide materials according to the present invention were superconductively transited at temperatures Tc of 80K or higher.

Figure 4:
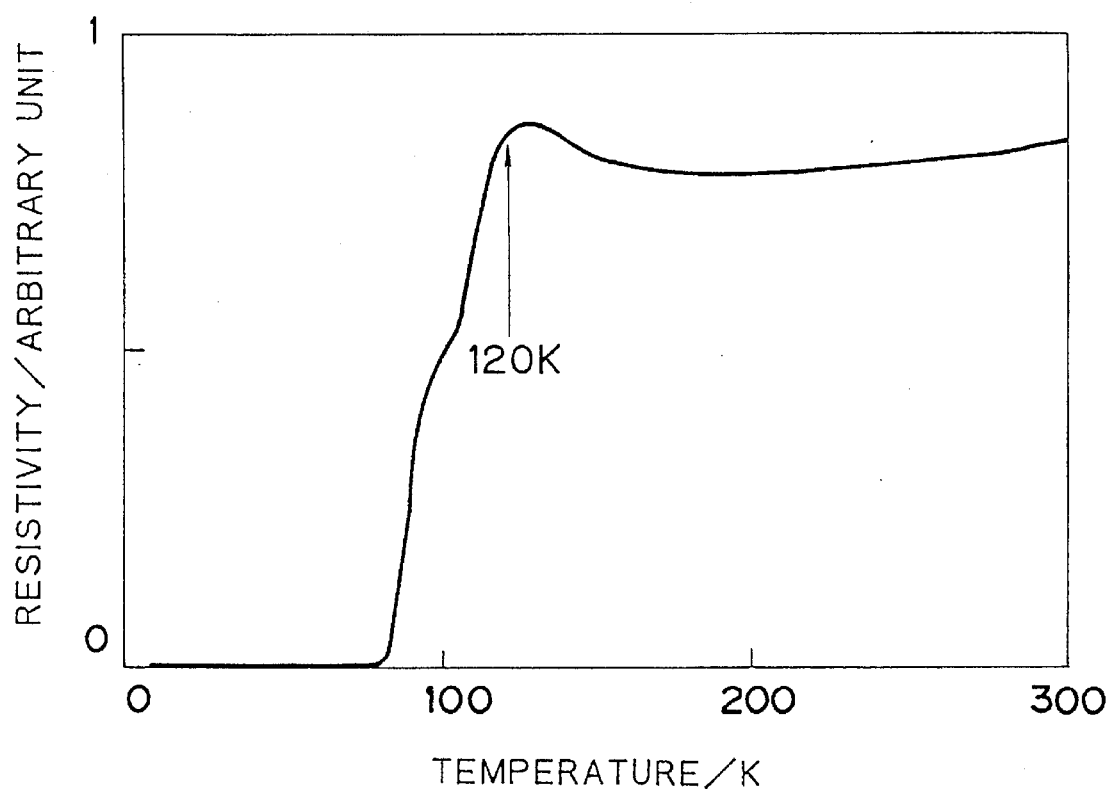
FIG. 4 is a graph which shows the result of measurement of the dependency of electric resistance upon the temperature according to Example 28.

FIG. 4 is a graph showing a temperature dependency of the electrical resistivity of the sample according to Example 28. As can be seen from FIG. 4, the material according to Example 28 commences superconductive transition at 120K and the resistance became zero at 85K.

As a result of the measurement of the susceptibility, the superconduction volume fraction at the liquid nitrogen temperature approached 70%. Therefore, excellent superconductive was obtained.

Further, the critical current density ratio α of the critical current density in each of the samples according to the present invention to that of the Y-type material were larger than 1. Further, it can be understood that excellent bonding was realized in the grain boundary. As a result of the measurements of the X-ray diffraction and the TEM, all of the samples according to the present invention had the single structure, that is, the single phase.

As can be seen from Table 7, materials having the composition formula satisfying the following range exhibited high Tc: $0.4 \leq a \leq 0.8$, $0.8 \leq b \leq 1.6$, $0.3 \leq c \leq 0.7$ and $0.5 \leq d \leq 1.5$.

TABLE 7

| Example No. | Composition Ratio | Tc (K) | Critical Current Density Ratio α |
|---|---|---|---|
| 26 | $Y_{0.4}Ca_{0.6}Sr_{0.7}Ba_{1.3}Cu_{0.6}C_{0.4}Cu_2O_7$ | 105 | 2.9 |
| 27 | $Nd_{0.5}Ca_{0.5}Sr_{0.5}Ba_{1.5}Cu_{0.6}C_{0.4}Cu_2O_7$ | 92 | 2.5 |
| 28 | $Er_{0.4}Ca_{0.6}Sr_{0.7}Ba_{1.3}Cu_{0.6}C_{0.4}Cu_2O_7$ | 120 | 3.0 |
| 29 | $Lu_{0.4}Ca_{0.6}Sr_{1.1}Ba_{0.9}Cu_{0.6}C_{0.4}Cu_2O_7$ | 100 | 2.5 |
| 30 | $Y_{0.7}Ca_{0.3}Sr_{0.7}Ba_{1.3}Cu_{0.6}C_{0.4}Cu_2O_7$ | 80 | 1.9 |
| 31 | $Y_{0.3}Ca_{0.7}Sr_{0.7}Ba_{1.3}Cu_{0.6}C_{0.6}Cu_2O_7$ | 95 | 2.3 |
| 32 | $Y_{0.4}Ca_{0.6}Sr_{1.5}Ba_{0.5}Cu_{0.6}C_{0.4}Cu_2O_7$ | 81 | 1.9 |
| 33 | $Y_{0.4}Ca_{0.6}Sr_{0.3}Ba_{1.7}Cu_{0.6}C_{0.4}Cu_2O_7$ | 83 | 2.0 |
| 34 | $Nd_{0.3}Lu_{0.2}Ca_{0.5}Sr_{0.7}Ba_{1.3}Cu_{0.8}C_{0.2}Cu_2O_7$ | 83 | 1.9 |
| 35 | $Y_{0.4}Ca_{0.6}Sr_{0.7}Ba_{1.3}Cu_{0.4}C_{0.6}Cu_2O_{6.5}$ | 82 | 2.0 |

Examples 36 to 40

As the materials, $Y_2O_3$, $CaCO_3$, $SrCO_3$, $BaCO_3$ and CuO were used. They were weighed to have the same composition ratio as that according to Example 26, and then they were dry mixed. Each of the mixtures was formed into a pellet shape having a diameter of 10 mm and a thickness of 1 mm by applying pressure. The pellet products were baked on an alumina boat in an atmosphere, the temperature of which was X°C and in which the partial pressure of $CO_2$ was Y atmospheres and the partial pressure of oxygen was Z atmospheres.

Then, the samples were annealed at 1000° C. in an atmosphere of 50 atm of oxygen. The electric resistance of each sample obtained as described above was measured in a temperature range from the room temperature to the temperature of liquid helium.

Samples judged as the single phase in the measurement of the X-ray diffraction were further discriminated by measuring the TEM whether or not their fine portions had the single phase. In order to examine whether or not deposition of impurities and so forth took place in the grain boundaries, proportion α of the critical current density in each sample to that of the Y-type material was measured under the same conditions, in which the Y-type material was baked in an oxygen atmosphere and had a critical temperature Tc of 93K. The critical current density was measured at 30K by a DC four-probe method.

Table 9 shows the manufacturing conditions for each example, that is, the baking temperature X°C, the partial pressure Y atm of $CO_2$ gas and the partial pressure Z atm of $O_2$ gas, Table 9 further showing the superconducting transition temperature and the critical electric current ratio α of the obtained materials.

As can be seen from Table 9, all of metal oxide materials obtained by the manufacturing method according to the present invention have transited to the superconductive state at 80K or higher.

Further, it can be understood from Table 9, the materials synthesized in an atmosphere in which the partial pressure of $CO_2$ was 0.001 to 0.02 atm, and in a temperature range of 850° to 1100° C. have a high Tc of 90K or higher.

Further, the critical current ratio α of the critical current density in each of the samples according to the present invention to that of the Y-type material were larger than 1. Further, it can be understood that excellent bonding was realized in the grain boundary. As a result of the measurements of the X-ray diffraction and the TEM, all of the samples according to the present invention had the single structure, that is, the single phase.

TABLE 9

Baking Conditions According to the Present Invention

| Example No. | Baking Temperature (X° C.) | Partial Pressure of $CO_2$ gas (Y atm) | Partial Pressure of $O_2$ gas (Z atm) | Tc (K) | Critical Current Density Ratio α |
|---|---|---|---|---|---|
| 36 | 820 | 0.01 | 0.99 | 82 | 2.0 |
| 37 | 970 | 0.02 | 0.99 | 105 | 2.9 |
| 38 | 1120 | 0.01 | 0.99 | 85 | 2.1 |
| 39 | 940 | 0.001 | 0.2 | 93 | 2.2 |
| 40 | 1000 | 0.2 | 3 | 87 | 2.1 |

Examples 41 to 45

As the materials, $Y_2O_3$, $CaCO_3$, $SrCO_3$, $BaCO_3$ and CuO were used, they were weighed to have the same composition ratio as that according to Example 26, and then they were dry mixed. Each of the mixtures was formed into a pellet shape having a diameter of 10 mm and a thickness of 1 mm by applying pressure. The pellet products were baked on an alumina boat in an atmosphere, the temperature of which was 1000° C. and in which the partial pressure of $CO_2$ was 0.1 atm and the partial pressure of oxygen was 0.99 atm.

Then, the samples were annealed at Y°C in an atmosphere of X atm of oxygen. As a result, metal oxide materials according to the present invention were obtained.

The electric resistance of each sample obtained as described above was measured in a temperature range from the room temperature to the temperature of liquid helium.

Samples judged as the single phase in the measurement of the X-ray diffraction were further discriminated by measuring the TEM whether or not their fine portions had the single phase. In order to examine whether or not deposition of impurities and so forth took place in the grain boundaries, proportion α of the critical current density in each sample to that of the Y-type material was measured under the same conditions, in which the Y-type material was baked in an oxygen atmosphere and had a critical temperature Tc of 93K. The critical current density was measured at 30K by a DC four-probe method.

Table 10 shows the X atm of the $O_2$ gas and the annealing temperature Y°C at the time of performing annealing, the superconducting transition temperature and the critical electric current density a of the obtained metal oxide material. As shown in Table 10, it was found that the metal oxide materials manufactured by the process according to the present invention transited to the superconductive state at 80K or higher.

As can be seen from Table 10, the samples obtained by annealing the baked samples at an oxygen pressure range from 10 atm to 1000 atm exhibited high Tc of 90K or higher.

Further, the critical current density ratio α of the critical current density in each of the samples according to the present invention to that of the Y-type material were larger than 1. Further, it can be understood that excellent bonding was realized in the grain boundary. As a result of the measurements of the X-ray diffraction and the TEM, all of the samples according to the present invention had the single structure, that is, the single phase.

TABLE 10

Annealing Conditions According to the Present Invention

| Example No. | Pressure of $O_2$ at annealing (X atm) | Annealing Temperature (Y° C.) | Tc (K) | Critical Current Density Ratio α |
|---|---|---|---|---|
| 41 | 5 | 400 | 81 | 1.9 |
| 42 | 50 | 800 | 105 | 2.9 |
| 43 | 500 | 1000 | 115 | 3.0 |
| 44 | 1200 | 1200 | 87 | 1.9 |
| 45 | 5 | 1000 | 83 | 1.9 |

As described above, the metal oxide material manufactured by the process according to the present invention exhibits the superconducting transition temperature of 80K or higher, and 120K if the optimum composition and synthesizing conditions are employed. Therefore, superconductive oxide material exhibiting excellent characteristics can be obtained as the superconductor.

Further, the process according to the present invention uses the raw material and produced compound which exhibit satisfactory restricted toxicity. Therefore, the process according to the present invention is a safety process enabling a novel superconductive oxide material to be obtained.

Further, the present invention enables a single-phase superconductive oxide material exhibiting a high Tc to be manufactured.

Although the invention has been described in its preferred form with a certain degree of particularly, it is understood that the present disclosure of the preferred form has been changed in the details of construction and the combination and arrangement of parts may be resorted to without departing from the spirit and the scope of the invention as hereinafter claimed.

What is claimed is:

1. A metal oxide material comprising components, the composition of which is expressed by the following composition formula (I):

$$Ln_a Ca_b Sr_c Ba_d Cu_{2+e-h} M_h O_{6+f} C_g \quad (I)$$

where a+b+c+d=3, $0.2 \leq a \leq 0.8$,
$0.2 \leq b \leq 1.0$, $0.3 \leq c \leq 2.2$,
$0 \leq d \leq 1.7$, $0 \leq e \leq 0.8$,
$0 \leq h \leq 0.2$, $0 < f < 2.0$,
$0.2 \leq g \leq 1.0$ Ln is one or more elements or atomic groups selected from a group consisting of Y and lanthanoid elements and M is one or more elements or atomic groups selected from a group consisting of Al, Si, Ti, V, Cr, Fe, Co, Ga, Ge and Pd; and wherein Cu atoms in the Cu-O chain layer of the composition are partially substituted by carbon atoms.

2. A metal oxide material according to claim 1, wherein h=0 in said composition formula (I).

3. A metal oxide material according to claim 1, wherein h=0, $0.5 \leq c \leq 2.2$ and $0 \leq d \leq 1.6$ in said composition formula (I).

4. A metal oxide material according to claim 1, wherein Ln is Y, a=1−x, b=x, $0.3 \leq x \leq 0.8$, c=2, d=0 and h=0.

5. A metal oxide material according to any one of claims 1 to 4, wherein the superconducting transition temperature is 50K or more.

6. A metal oxide material according to claim 1, wherein $Cu_{2+e-h}$ in Formula I is represented as $Cu_{3-g-h}$.

* * * * *

UNITED STATES PATENT AND TRADEMARK OFFICE
CERTIFICATE OF CORRECTION

PATENT NO. : 5,578,554

DATED : November 26, 1996

INVENTOR(S): JUN AKIMITSU, ET AL.

It is certified that error appears in the above-identified patent and that said Letters Patent is hereby corrected as shown below:

On the title page, Item
AT [56], REFERENCES CITED, OTHER PUBLICATIONS
  Under "Y. Matsumoto et al.;" "$Cu_{3-2}N_2O_3$" should read
    --$Cu_{3-z}N_zO_\delta$--.

COLUMN 2
  Line 23, "particles for," should read --particles, for--.

COLUMN 4
  Line 47, "$0.3c \leqq 2.2$," should read --$0.3 \leqq c \leqq 2.2$,--.

COLUMN 8
  Line 60, "error" should read --error of--.

COLUMN 10
  Line 32, "error" should read --error of--.
  Line 55, "transited." should read --transit.--.

COLUMN 13
  Line 27, "36" should read --35--.
  Line 58, "four-Probe" should read --four-probe--.

COLUMN 14
  Line 22, "ductive" should read --ductivity--.

UNITED STATES PATENT AND TRADEMARK OFFICE
CERTIFICATE OF CORRECTION

PATENT NO.   :  5,578,554

DATED        :  November 26, 1996

INVENTOR(S) :  JUN AKIMITSU, ET AL.

It is certified that error appears in the above-identified patent and that said Letters Patent is hereby corrected as shown below:

<u>COLUMN 16</u>
  Line 62, "particularly," should read --particularity--.

Signed and Sealed this

Twentieth Day of May, 1997

Attest:

BRUCE LEHMAN

*Attesting Officer*          *Commissioner of Patents and Trademarks*